US009970097B2

(12) United States Patent
Wang

(10) Patent No.: US 9,970,097 B2
(45) Date of Patent: May 15, 2018

(54) ROTARY EVAPORATION SOURCE APPARATUS FOR OLED EVAPORATION

(71) Applicant: BOE TECHNOLOGY GROUP CO., LTD., Beijing (CN)

(72) Inventor: Lu Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 245 days.

(21) Appl. No.: 14/653,995

(22) PCT Filed: Oct. 11, 2014

(86) PCT No.: PCT/CN2014/088388
§ 371 (c)(1),
(2) Date: Jun. 19, 2015

(87) PCT Pub. No.: WO2015/192551
PCT Pub. Date: Dec. 23, 2015

(65) Prior Publication Data
US 2016/0258052 A1  Sep. 8, 2016

(30) Foreign Application Priority Data
Jun. 17, 2014 (CN) .......................... 2014 1 0270011

(51) Int. Cl.
*C23C 16/00* (2006.01)
*C23C 14/24* (2006.01)
(Continued)

(52) U.S. Cl.
CPC ............ *C23C 14/243* (2013.01); *C23C 14/24* (2013.01); *H01L 51/56* (2013.01); *H01L 51/001* (2013.01)

(58) Field of Classification Search
CPC .................................................. C23C 14/243
(Continued)

(56) References Cited

U.S. PATENT DOCUMENTS 4,592,306 A * 6/1986 Gallego ................ C23C 14/568
118/50.1
4,984,531 A * 1/1991 Zejda .................. H01L 21/6838
118/50
(Continued)

FOREIGN PATENT DOCUMENTS

CN  101275218 A  10/2008
CN  201305624 A   9/2009
(Continued)

OTHER PUBLICATIONS

English translation CN 101275218, Song et al. 10-1008.*
(Continued)

*Primary Examiner* — Keath T Chen
(74) *Attorney, Agent, or Firm* — Collard & Roe, P.C.

(57) ABSTRACT

The present disclosure discloses a rotary evaporation source apparatus for OLED evaporation, comprising a crucible for containing evaporation material, an evaporation source body for heating the crucible, a rotary disk for rotating the crucible, and a driving source member for driving the rotary disk to rotate; wherein the evaporation source body is provided with a receiving space for receiving the crucible therein, a through hole is disposed on the rotary disk, the rotary disk is movably laid over the evaporation source body, the crucible passes through the through hole disposed on the rotary disk and is placed in the receiving space, the crucible and the rotary disk are disposed in a relatively stationary manner; the driving source member is disposed at outside of the evaporation source body and drives the rotary disk to rotate about a central axis of the evaporation source body, the crucible rotates about the central axis of the evaporation source body along with the rotary disk.

12 Claims, 7 Drawing Sheets

(51) Int. Cl.
  *H01L 51/56* (2006.01)
  *H01L 51/00* (2006.01)
(58) Field of Classification Search
  USPC .......................................................... 118/726
  See application file for complete search history.

(56) References Cited

U.S. PATENT DOCUMENTS

| | | | | |
|---|---|---|---|---|
| 2004/0139914 | A1* | 7/2004 | Yamazaki | ............... C23C 14/12 |
| | | | | 118/719 |
| 2006/0096542 | A1* | 5/2006 | Ryu | ........................ C23C 14/12 |
| | | | | 118/726 |

FOREIGN PATENT DOCUMENTS

| CN | 201778103 | U | 3/2011 |
|---|---|---|---|
| CN | 102131955 | A | 7/2011 |
| CN | 102282648 | A | 12/2011 |
| CN | 103469161 | A | 12/2013 |
| CN | 104073764 | A | 10/2014 |
| JP | S 61-113762 | A | 5/1986 |
| JP | S 62-156267 | A | 7/1987 |
| JP | S 63-312972 | A | 12/1988 |

OTHER PUBLICATIONS

International Search Report of PCT/CN2014/088388 in Chinese, dated Mar. 11, 2015 with English translation.
Notice of Transmittal of the International Search Report of PCT/CN2014/088388 in Chinese, dated Mar. 11, 2015.
Written Opinion of the International Searching Authority of PCT/CN2014/088388 in Chinese, dated Mar. 11, 2015 with English translation.
Chinese Office Action of Chinese Application No. 201410270011.1, dated Nov. 25, 2015 with English translation.

\* cited by examiner

ROTARY EVAPORATION SOURCE APPARATUS FOR OLED EVAPORATION

CROSS REFERENCE TO RELATED APPLICATIONS

This application is the National Stage of PCT/CN2014/088388 filed on Oct. 11, 2014, which claims priority under 35 U.S.C. § 119 of Chinese Application No. 201410270011.1 filed on Jun. 17, 2014, the disclosure of which is incorporated by reference.

TECHNICAL FIELD

Embodiments of the present disclosure relate to a rotary evaporation source apparatus for OLED evaporation.

BACKGROUND

At present, a prevailing technology and method for preparing organic light emitting diodes (OLED, Organic Light Emitting Diode) is an evaporation method, in which organic materials with small molecules are heated in a vacuum cavity, and are sublimated or melted and gasified into steam, and then deposited on a glass substrate through openings in a metal mask.

When a display device of a display apparatus is manufactured, an evaporation crucible is usually used. The evaporation crucible has a containing means. The evaporation crucible is placed in an evaporation source (for example, a point source). A crucible cap is mounted at the opening of the containing means and is provided with evaporation apertures. Its operation principle is as follows. The evaporation material comprising organic materials is placed in the containing means of the evaporation crucible. The evaporation crucible is placed into the evaporation source, and the evaporation source heats the evaporation crucible so that the gasified evaporation material is uniformly evaporated out of the evaporation apertures of the crucible cap. A sensor for detecting the evaporation speed of the gasified evaporation material is disposed above the crucible cap. The sensor feeds back the detected signal to the evaporation source so that the evaporation source controls intensity of heating the evaporation crucible based on the evaporation speed of the evaporation material.

In the OLED evaporation apparatus, evaporation material is placed in the crucible, and the crucible is placed in the evaporation source. The crucible is heated by a heater within a heating source and the evaporation material is evaporated in a vacuum environment. In the current OLED evaporation apparatus, the crucible is placed in the evaporation source in a stationary manner. Since that peripheries of the crucible are uniformly heated cannot be completely guaranteed, as illustrated in FIG. 1, there is a phenomenon that the material within the crucible is not heated uniformly which causes an unstable evaporation process.

SUMMARY

One of the technical problems to be solved by embodiments of the present disclosure is to overcome the problem of the crucible not being uniformly heated and to improve stability of the evaporation.

To solve the above technical problem, at least one embodiment of the present disclosure provides a rotary evaporation source apparatus for OLED evaporation, comprising:

a crucible for containing evaporation material, an evaporation source body for heating the crucible, a rotary disk for rotating the crucible, and a driving source member for driving the rotary disk to rotate; wherein the evaporation source body is provided with a space for receiving the crucible therein, a through hole is disposed on the rotary disk, the rotary disk is movably laid over the evaporation source body, the crucible passes through the through hole disposed on the rotary disk and is placed on the rotary disk in a stationary manner relative to the rotary disk; and the driving source member is disposed at outside of the evaporation source body and drives the rotary disk to rotate about a central axis of the evaporation source body, the crucible rotates about the central axis of the evaporation source body along with the rotary disk.

In one embodiment according to the present disclosure, a plurality of turning wheels are disposed on an outer periphery of the rotary disk, and the turning wheels rotate along an outer periphery of the evaporation source body along with the rotary disk.

In one embodiment according to the present disclosure, the rotary evaporation source apparatus further comprises a chassis, the chassis is provided with a through hole thereon through which the crucible passes;

the chassis is fixedly disposed on an upper end face of the evaporation source body, and the chassis is provided with a flange at its outer periphery, and the inner diameter of the flange is slightly greater than the outer diameter of the rotary disk.

In one embodiment according to the present disclosure, a track is provided in an inner side of the flange so that the turning wheels travel along the inner side of the flange.

In one embodiment according to the present disclosure, a protrusion is disposed on a cap of the crucible; the protrusion extends outwardly along an outer periphery of the cap of the crucible.

In one embodiment according to the present disclosure, there are a plurality of protrusions, and the protrusions are regularly distributed on the cap of the crucible.

In one embodiment according to the present disclosure, a groove which matches with the protrusion is disposed on the rotary disk.

In one embodiment according to the present disclosure, the protrusion has a cylindrical shape.

In one embodiment according to the present disclosure, the cap of the crucible is provided with a lift handle.

In one embodiment according to the present disclosure, the driving source member comprises a motor and a driving disk connected to a rotation shaft of the motor; gears are disposed at both an outer edge of the driving disk and an outer edge of the rotary disk, and the driving source member is meshed with the rotary disk.

The rotary evaporation source apparatus for OLED evaporation according to the embodiments of the present disclosure drives the driving disk to rotate through a motor and rotates the crucible in the evaporation source. The problem that heating is not uniform is overcome through the rotation of the crucible and the uniformity in temperature of the crucible is improved. Thus evaporation stability is improved.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
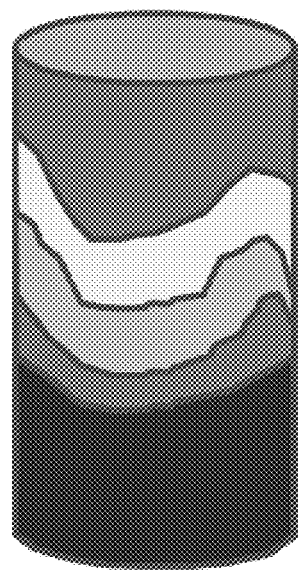
FIG. 1 is an illustrative view of a heat distribution state of a crucible of the known art by the present inventor when being heated.
Figure 2:
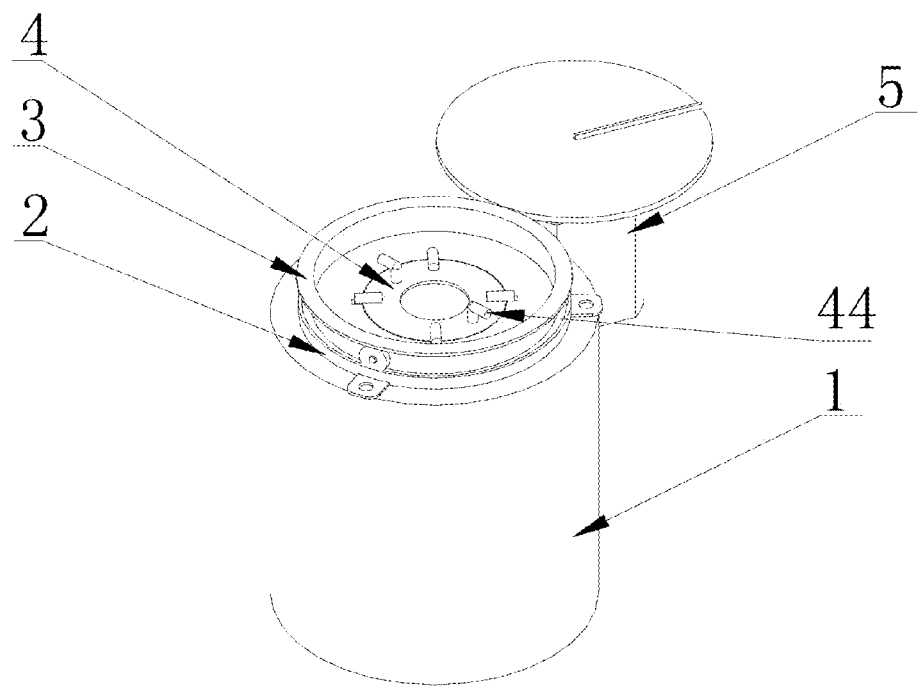
FIG. 2 is an illustrative view of the whole structure of the rotary evaporation source apparatus according to an embodiment of the present disclosure.
Figure 3:
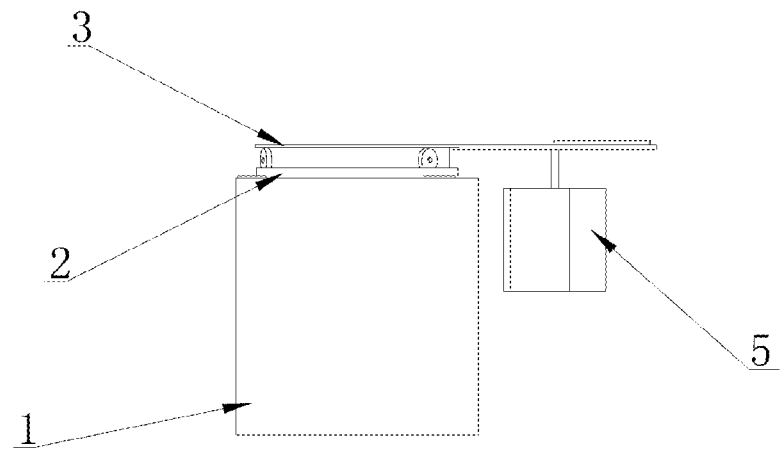
FIG. 3 is a side view of the rotary evaporation source apparatus according to an embodiment of the present disclosure.
Figure 4:
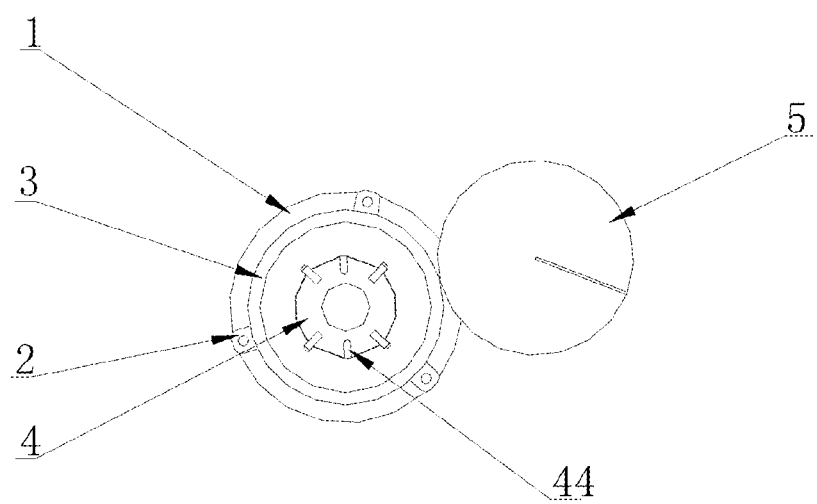
FIG. 4 is a top view of the rotary evaporation source apparatus according to an embodiment of the present disclosure.

As illustrated in FIG. 2 to FIG. 4, one embodiment of the present disclosure is to provide a rotary evaporation source apparatus for OLED evaporation. The rotary evaporation source apparatus comprises a crucible 4 for containing evaporation material, an evaporation source body 1 for heating the crucible 4, a rotary disk 3 for rotating the crucible 4, and a driving source member 5 for driving the rotary disk 3 to rotate. The evaporation source body 1 is provided with a space for receiving the crucible 4 therein. A through hole 31 is disposed on the rotary disk 3. The rotary disk 3 is movably laid over an upper end face of the evaporation source body 1. The crucible 4 passes through the through hole 31 disposed on the rotary disk 3 and is placed on the rotary disk 3. The crucible 4 is placed on the rotary disk 3 in a relatively stationary manner. The driving source member 5 is disposed at outside of the evaporation source body 1 and fixed. The driving source member 5 drives the rotary disk 3 to rotate about a central axis of the evaporation source body 1. The crucible 4 rotates about the central axis of the evaporation source body 1 along with the rotary disk 3. The present rotary evaporation source apparatus is described in detail below.

Figure 5:
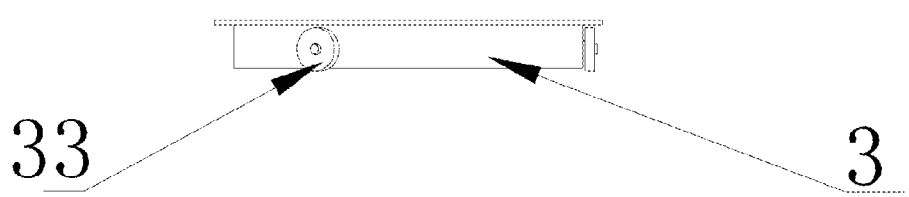
FIG. 5 is a side view of the rotary disk of the rotary evaporation source apparatus according to an embodiment of the present disclosure.
Figure 6:
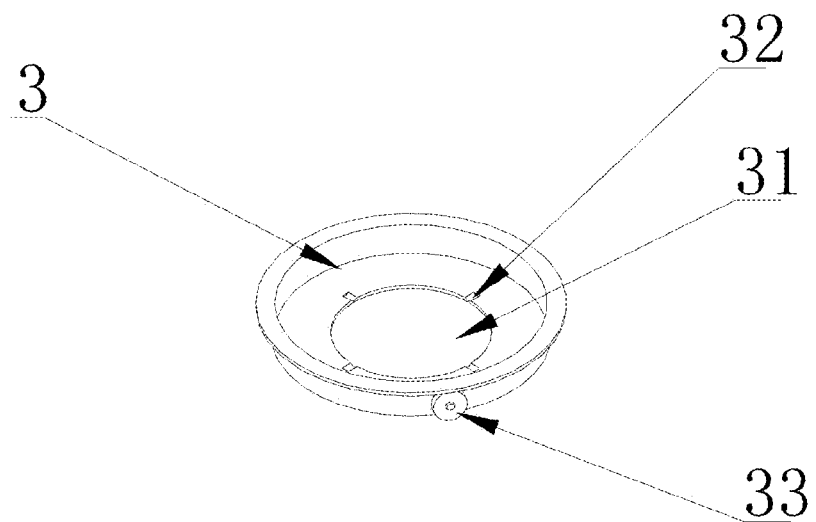
FIG. 6 is a perspective view of the rotary disk of the rotary evaporation source apparatus according to an embodiment of the present disclosure.
Figure 7:
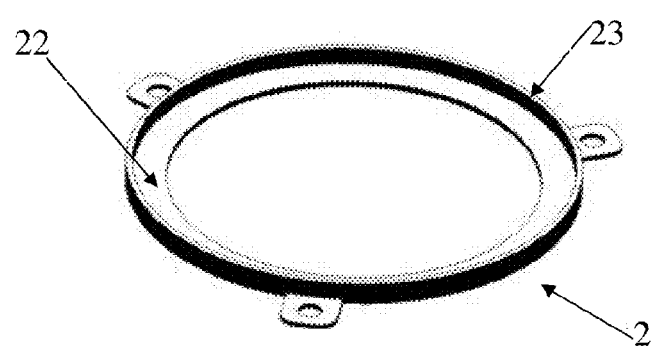
FIG. 7 is a perspective view of the chassis of the rotary evaporation source apparatus according to an embodiment of the present disclosure.

As illustrated in FIG. 5 and FIG. 6, in one embodiment of the present disclosure, to make the rotary disk 3 rotate in a more flexible manner and thereby prevent the rotary disk 3 from being blocked during the course of rotating and thus damaging the evaporation source body 1, a plurality of turning wheels 33 are disposed at an outer periphery of the rotary disk 3. The turning wheels 33 rotate along an outer periphery of the evaporation source body 1 along with the rotary disk 3.

Figure 8:
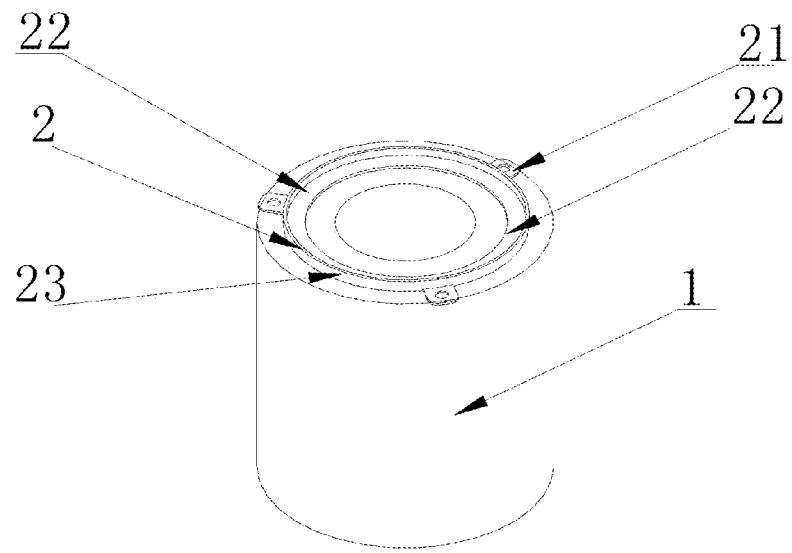
FIG. 8 is an illustrative view of the whole structure of the chassis of the rotary evaporation source apparatus according to an embodiment of the present disclosure.
Figure 9:
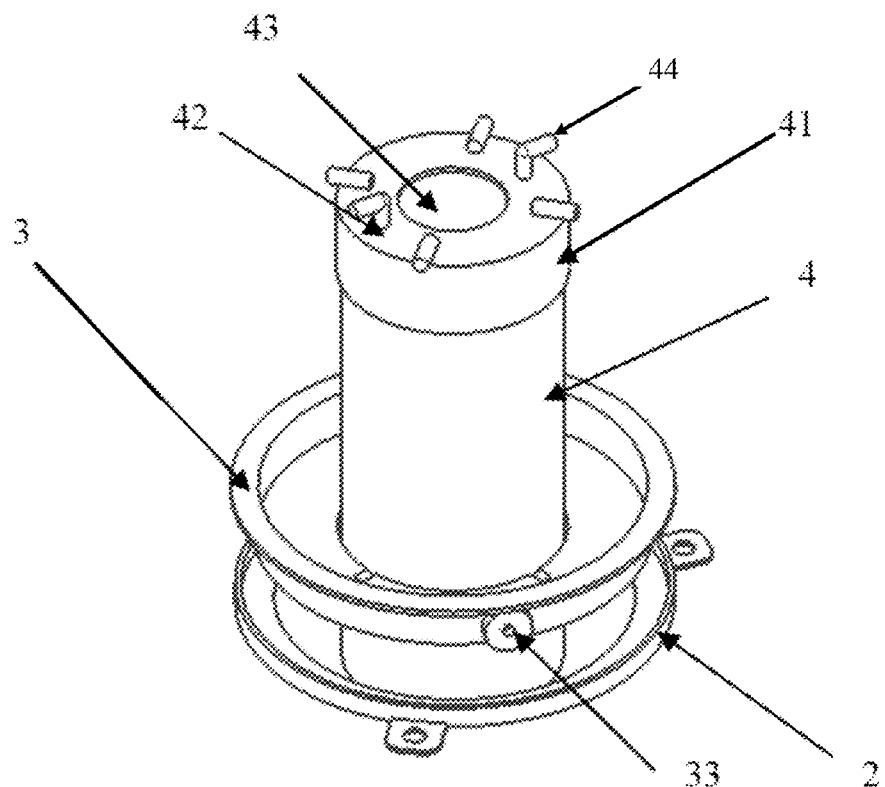
FIG. 9 is an illustrative view of the assembling of the chassis of the rotary evaporation source apparatus according to an embodiment of the present disclosure.
Figure 10:
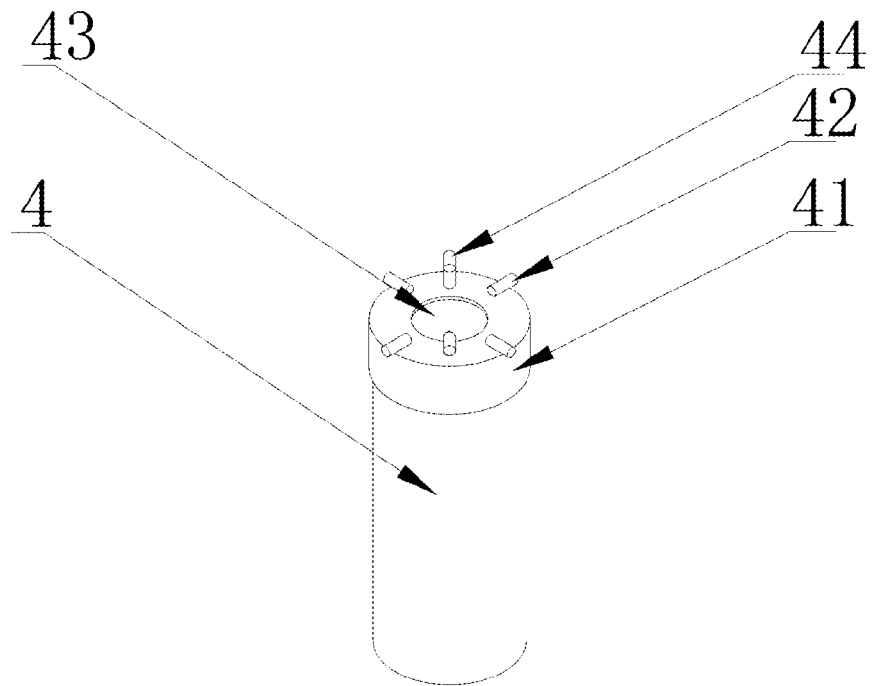
FIG. 10 is a perspective view of the crucible of the rotary evaporation source apparatus according to an embodiment of the present disclosure.
Figure 11:
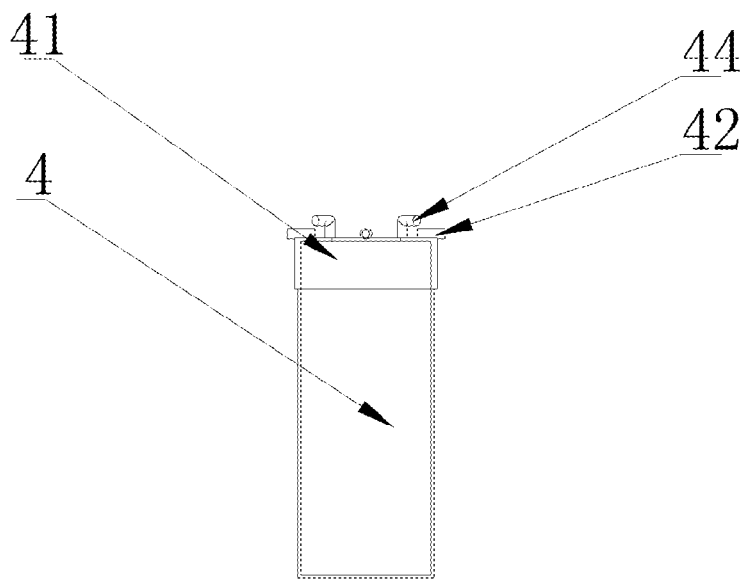
FIG. 11 is a side view of the crucible of the rotary evaporation source apparatus according to an embodiment of the present disclosure.
Figure 12:
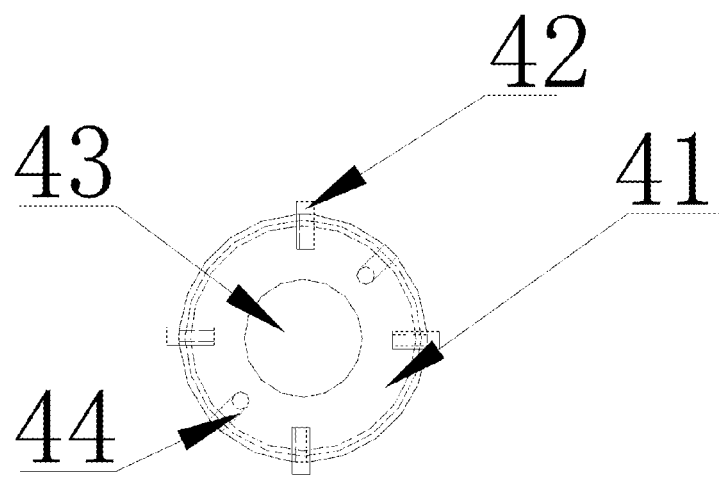
FIG. 12 is a top view of the crucible of the rotary evaporation source apparatus according to an embodiment of the present disclosure.

As illustrated in FIG. 2, FIG. 4, and FIG. 7 to FIG. 9, in order to make the rotary disk 3 rotate about the central axis of the evaporation source body 1 in a more stable manner, a chassis 2 is provided in one embodiment of the present disclosure. The chassis 2 is provided with a through hole through which the crucible 4 passes. The chassis 2 is fixedly disposed on the upper end face of the evaporation source body 1 and the chassis 2 is provided with a flange 23 at its outer periphery. The inner diameter of the flange 23 is slightly greater than the outer diameter of the rotary disk 3. The flange 23 can effectively prevent the rotary disk 3 from being slipped off during the course of rotating. In order to further restrict the plurality of turning wheels 33 disposed at the outer periphery of the rotary disk 3 to travel along an inner side of the flange 23 of the chassis 2 and thus restrict the rotary disk 3 to rotate about the central axis of the evaporation source body 1, a track 22 is provided in the inner side of the flange 23 so that the plurality of turning wheels 33 travel along the inner side of the flange 23. As illustrated in FIG. 9, when assembling the rotary evaporation source apparatus according to the embodiments of the present disclosure, the chassis 2 is laid over the upper end face of the evaporation source body 1 at first, and then the plurality of turning wheels 33 disposed at the outer periphery of the rotary disk 3 is placed into the track 22, and finally the crucible 4 is received in the evaporation source body 1 by passing through the through hole 31 disposed on the rotary disk 3 and the through hole disposed on the chassis 2. As illustrated in FIG. 8, to make the plurality of turning wheels 33 travel along the inner side of the flange 23 of the chassis 2 more stable, the chassis 2 is further provided with fastening holes 21 at its outer periphery. The chassis 2 is fastened to the evaporation source body 1 through the fastening holes 21 so that it is more stable for the plurality of turning wheels 33 to travel on the track 22.

Figure 13:
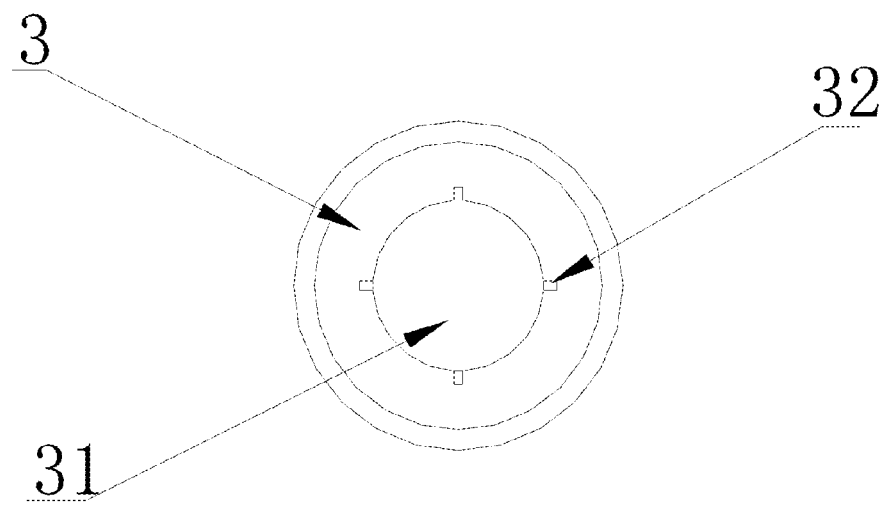
FIG. 13 is a top view of the rotary disk of the rotary evaporation source apparatus according to an embodiment of the present disclosure.

As illustrated in FIG. 10 to FIG. 13, to facilitate taking and placing of the crucible 4 and to facilitate the rotation of the crucible along with the rotary disk 3, a protrusion 42 is disposed on an cap 41 of the crucible 4. The protrusion 42 extends towards an outer periphery of the cap 41. A through hole 43 for the evaporating of evaporation material is disposed on the cap 41 of the crucible 4. To further improve balance and stability of the rotation of the crucible 4 along with the rotary disk 3, a plurality of protrusion 42 are disposed on the cap 41 and the protrusions 42 are regularly distributed on the cap 41. For example, there may be four protrusions 42. The protrusions 42 can increase the friction between the crucible 4 and the rotary disk 3 so that the crucible 4 and the rotary disk 3 are made stationary relative to each other. Due to the protrusions 42, the diameter of the cap 41 in the direction of the protrusions 42 is slightly greater than the diameter of the through hole 31 disposed on the rotary disk 3. As illustrated in FIG. 6 and FIG. 13, to further facilitate the rotation of the crucible 4 along with the rotary disk 3 so that the crucible 4 and the rotary disk 3 are kept stationary relative to each other, a groove 32 matching the protrusion 42 is disposed at a position corresponding to the protrusion 42 on the rotary disk 3. On the other hand, providing the groove 32 corresponding to the protrusion 42 can facilitate the positioning between the crucible 4 and the rotary disk 3 when the crucible 4 is assembled. In the embodiments of the present disclosure, by using the rotary disk 3 instead of the cap of the evaporation source currently used, which can function as the cap of the evaporation source, assembly and detachment are made easier.

As illustrated in FIG. 4, and FIG. 9 to FIG. 12, in order to facilitate separation of the rotary disk 3 and the crucible 4 when the crucible 4 needs to be taken out, a lift handle 44 is provided on the cap 41 of the crucible 4. For example, the lift handle 44 is a hanging arm 44 which has a shape of L. One end of the hanging arm 44 is secured to an upper end face of the upper cap 41 of the crucible 4, and the other end of the hanging arm 44 extends towards the direction of the rotary disk 3, so that the crucible 4 is easily detached from the rotary disk 3 when the crucible 4 needs to be removed. Of course, it would be appreciated that the embodiment of the present disclosure is not limited to the above. The effect of the embodiments of the present disclosure can also be obtained by other means or structures for easy separation of the crucible 4 and the rotary disk 3, such as a tab, and etc.

To prevent the crucible 4 from being blocked and thus being not able to rotate, otherwise the evaporation source body 1 would be damaged if the rotary disk 3 is blocked, the protrusion 42 is configured to be cylindrical in one embodiment. Even if the crucible 4 is blocked, the rotary disk 3 will not be blocked by the crucible 4 and is able to continue to rotate, thereby avoiding a direct damage to the evaporation source body 1.

In one embodiment of the present disclosure, the crucible 4 is disposed on the rotary disk 3 in a relatively stationary manner. However, the embodiment of the present disclosure is not limited to the above connection means, and other connection means can be selected. For example, the outer periphery of the cap 41 of the crucible 4 is extended towards the direction of the rotary disk 3 so that the outer periphery of the cap 41 is larger than the through hole 31 disposed on the rotary disk 3. All required is that the friction at the contacting face between the cap 41 and the rotary disk 3 is large enough to make the crucible 4 rotate along with the rotary disk 3. In one embodiment, a lower surface of the extended region of the outer periphery is provided with protrusions, which can also achieve the effect of making the crucible 4 and the rotary disk 3 disposed in a relatively stationary manner. Furthermore, it is also possible to provide grooves on a lower surface of the extended region of the outer periphery and provide protrusions on an upper surface of the rotary disk 3, which can also achieve the effect of making the crucible 4 and the rotary disk connected in a relatively stationary manner. Other configurations will not be discussed in further detail.

Figure 14:
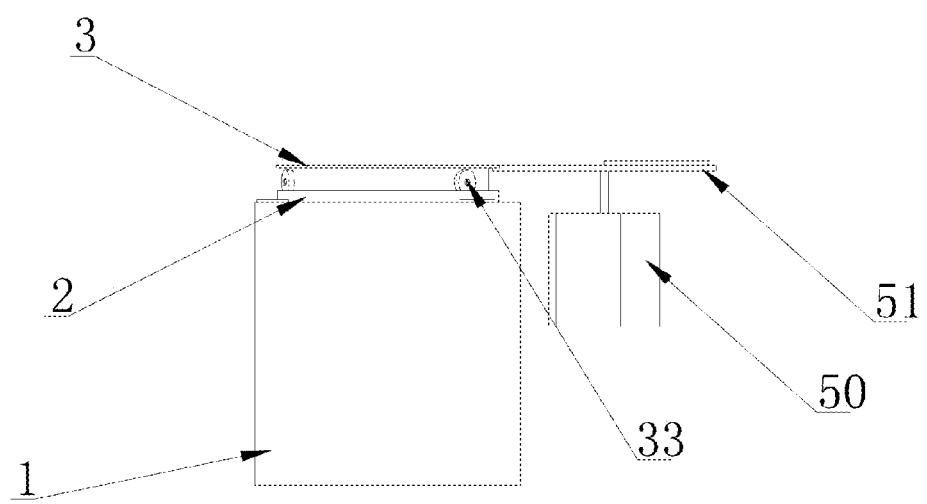
FIG. 14 is a side view of the rotary evaporation source apparatus according to an embodiment of the present disclosure.

As illustrated in FIG. 2, FIG. 4 and FIG. 14, in the rotary evaporation source apparatus according to the embodiments of the present disclosure, the driving source member 5 has a motor-driving mode. For example, the driving source member 5 uses a fixed motor 50 and a driving disk 51 connected to the rotation shaft of the motor 50. For example, gears are disposed at both an outer edge of the driving disk 51 and an outer edge of the rotary disk, and the driving source member 5 is meshed with the rotary disk 3. Of course, it would be appreciated that the embodiment of the present disclosure is not limited to this. Other transmission means can be adopted to achieve the transmission between the driving source member 5 and the rotary disk 3, such as transmission by means of a chain or a belt.

Figure 15:
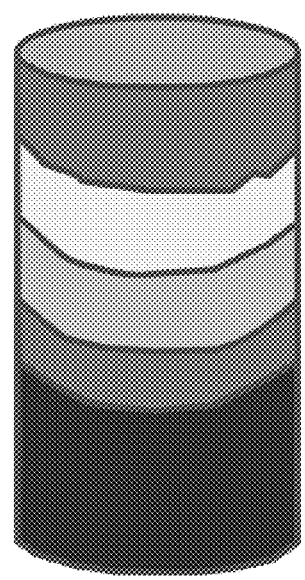
FIG. 15 is an illustrative view of the heating state of the crucible according to an embodiment of the present disclosure.

In the rotary evaporation source apparatus for OLED evaporation according to the embodiment of the present disclosure, the crucible 4 is disposed on a rotatable rotary disk 3 and the rotary disk 3 rotates on a circular track 22 thereby ensuring that it will not slip off. The track 22 is fixed on the upper end face of the evaporation source body 1. As illustrated in FIG. 15, in one embodiment according to the present disclosure, the rotation of the driving disk 51 is controlled by the motor and the rotary disk 3 is driven to rotate, thereby achieving a synchronous rotation of the crucible 4 in the evaporation source body 1 with the rotary disk 3. The problem that heating is not uniform is addressed by the rotation of the crucible 4, and thus the stability of evaporation is improved.

In the embodiment according to the present disclosure, since the crucible 4 is driven by the motor 50 to rotate and the currently used cap of the evaporation source is replaced by the rotary disk 3 which can function as the cap of the evaporation source, the assembly and detachment will be easier. Not only taking and placing of the crucible 4 are convenient, but also the problem that the crucible is not uniformly heated and the problem that the evaporation stability is not high are effectively eliminated.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201410270011.1 filed on Jun. 17, 2014, the disclosure of which is hereby entirely incorporated by reference.

The invention claimed is:

1. A rotary evaporation source apparatus for preparing an organic light emitting diodes, comprising: a crucible for containing evaporation material, an evaporation source body for heating the crucible, a rotary disk for rotating the crucible, and a driving source member for driving the rotary disk to rotate;

wherein the evaporation source body is provided with a receiving space for receiving the crucible therein, a through hole is disposed on the rotary disk, the rotary disk is movably laid over the evaporation source body, the crucible passes through the through hole disposed on the rotary disk and is placed in the receiving space in a stationary manner relative to the rotary disk;

the driving source member is disposed at outside of the evaporation source body and drives the rotary disk to rotate about a central axis of the evaporation source body, the crucible rotates about the central axis of the evaporation source body along with the rotary disk;

wherein the rotary evaporation source apparatus further comprises a chassis, the chassis is provided with a through hole thereon through which the crucible passes; and the chassis is fixedly disposed on an upper end face of the evaporation source body, and the chassis is provided with a flange at its outer periphery, and the inner diameter of the flange is slightly greater than the outer diameter of the rotary disk.

2. The rotary evaporation source apparatus according to claim 1, wherein one or more protrusions are disposed on a cap of the crucible and the one or more protrusions extends outwardly on an outer periphery of the cap of the crucible.

3. The rotary evaporation source apparatus according to claim 2, wherein a plurality of protrusions are provided, and the plurality of protrusions are distributed evenly on the cap of the crucible.

4. The rotary evaporation source apparatus according to claim 3, wherein one or more grooves which match with the one or more protrusions are disposed on the rotary disk.

5. The rotary evaporation source apparatus according to claim 3, wherein the one or more protrusion are cylindrical.

6. The rotary evaporation source apparatus according to claim 3, wherein a cap of the crucible is provided with a lift handle.

7. The rotary evaporation source apparatus according to claim 2, wherein one or more grooves which match with the one or more protrusions are disposed on the rotary disk.

8. The rotary evaporation source apparatus according to claim 7, wherein the one or more protrusions are cylindrical.

9. The rotary evaporation source apparatus according to claim 2, wherein the one or more protrusions are cylindrical.

10. The rotary evaporation source apparatus according to claim 2, wherein the cap of the crucible is provided with a lift handle.

11. The rotary evaporation source apparatus according to claim 2, wherein a cap of the crucible is provided with a lift handle.

12. The rotary evaporation source apparatus according to claim 1, wherein the driving source member comprises a motor and a driving disk connected to a rotation shaft of the motor;

gears are disposed at both an outer edge of the driving disk and an outer edge of the rotary disk, and the driving source member is meshed with the rotary disk.

* * * * *